US012336407B2

(12) United States Patent
Zheng

(10) Patent No.: US 12,336,407 B2
(45) Date of Patent: Jun. 17, 2025

(54) DISPLAY PANEL AND DISPLAY DEVICE

(71) Applicant: WUHAN CHINA STAR OPTOELECTRONICS SEMICONDUCTOR DISPLAY TECHNOLOGY CO., LTD., Wuhan (CN)

(72) Inventor: Ying Zheng, Wuhan (CN)

(73) Assignee: WUHAN CHINA STAR OPTOELECTRONIC SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 503 days.

(21) Appl. No.: 17/899,894

(22) Filed: Aug. 31, 2022

(65) Prior Publication Data
US 2024/0040874 A1 Feb. 1, 2024

(30) Foreign Application Priority Data

Jul. 26, 2022 (CN) .......................... 202210884922.8

(51) Int. Cl.
*H10K 59/131* (2023.01)
*H10K 59/126* (2023.01)

(52) U.S. Cl.
CPC ....... *H10K 59/1315* (2023.02); *H10K 59/126* (2023.02); *H10K 59/131* (2023.02)

(58) Field of Classification Search
CPC . H10K 59/1315; H10K 59/126; H10K 59/131
See application file for complete search history.

(56) References Cited

U.S. PATENT DOCUMENTS

| 10,847,545 | B2 * | 11/2020 | Lee | H10D 30/6723 |
|---|---|---|---|---|
| 2022/0140043 | A1 * | 5/2022 | Cao | H10K 59/126 |
| | | | | 257/43 |
| 2023/0157090 | A1 * | 5/2023 | Kim | H10K 59/126 |
| | | | | 257/40 |
| 2024/0013727 | A1 * | 1/2024 | Zhang | G09G 3/3266 |
| 2024/0049529 | A1 * | 2/2024 | Yang | H10K 59/131 |
| 2024/0379046 | A1 * | 11/2024 | Hu | G09G 3/32 |

* cited by examiner

*Primary Examiner* — Michael M Trinh
(74) *Attorney, Agent, or Firm* — The Roy Gross Law Firm, LLC; Roy D. Gross

(57) ABSTRACT

A display panel and a display device are provided. The display panel includes a substrate; a light-shielding metal layer disposed on a side of the substrate, wherein the light-shielding metal layer includes a first trace disposed in a frame area; a driving circuit layer disposed on a side of the light-shielding metal layer away from the substrate, wherein the driving circuit layer includes a pixel driving circuit disposed in the display area and a gate driving circuit disposed in the frame area; a first electrode disposed on a side of the driving circuit layer away from the substrate; a light-emitting layer disposed on a side of the first electrode away from the substrate; and a second electrode disposed on a side of the light-emitting layer away from the substrate, wherein the first trace and the gate driving circuit are at least partially overlapped.

10 Claims, 3 Drawing Sheets

DISPLAY PANEL AND DISPLAY DEVICE

CROSS REFERENCE TO RELATED APPLICATIONS

This application claims the benefit of priority of Chinese Patent Application No. 202210884922.8, filed Jul. 26, 2022, the contents of which are all incorporated herein by reference in their entirety.

FIELD OF INVENTION

The invention relates to the field of display panels, and particularly to a display panel and a display device.

BACKGROUND

Compared with liquid crystal displays, organic light-emitting diode (OLED) display panels have the advantages of being lighter and thinner, better display effect, higher resolution, wider color gamut, lower power consumption and flexible display. Therefore, it has developed rapidly in recent years and has become the preferred display panel type for mobile terminals.

Existing OLED display panels generally include a display area for performing display functions and a frame area on one side of the display area. The frame area needs to be provided with various driving circuits and various signal lines, such as gate driving circuits and cathode trace (VSS trace). At present, to reduce the number of masks and save the production cost, in the structural design of the display panel, the cathode trace for transmitting the VSS signal and the gate driving circuit are formed in the manner of film sharing. Meanwhile, to ensure the signal transmission quality of the VSS signal in the cathode trace, a width of the cathode trace needs to meet certain design requirements. As a result, the cathode trace with wider widths and the gate driving circuit occupy the space of the frame area together, thereby causing the problem that the width of the frame area of the display panel is larger.

Technical Solution

Embodiments of the present invention provide a display panel and a display device, and signal transmission quality of the VSS signal can be ensured and the problem of the large width of the frame area existing in the existing OLED display panel can be solved at the same time.

In order to solve the above technical problems, the present application provides a display panel, the display panel comprises a display area and a frame area arranged on a side of the display area,
  wherein the display panel comprises:
  a substrate;
  a light-shielding metal layer disposed on a side of the substrate, wherein the light-shielding metal layer comprises a first trace disposed in the frame area;
  a driving circuit layer disposed on a side of the light-shielding metal layer away from the substrate, wherein the driving circuit layer comprises a pixel driving circuit disposed in the display area and a gate driving circuit disposed in the frame area, and the gate driving circuit is electrically connected to the pixel drive circuit;
  a first electrode disposed on a side of the driving circuit layer away from the substrate;
  a light-emitting layer disposed on a side of the first electrode away from the substrate; and
  a second electrode disposed on a side of the light-emitting layer away from the substrate, and the second electrode is electrically connected to the first trace through a via hole,
  wherein, the first trace and the gate driving circuit are at least partially overlapped.

Optionally, the driving circuit layer comprises:
  a semiconductor layer disposed on a side of the light-shielding metal layer away from the substrate, wherein the semiconductor layer comprises a first semiconductor corresponding to the pixel driving circuit and a second semiconductor corresponding to the gate driving circuit;
  a first metal layer disposed on a side of the semiconductor layer away from the substrate, wherein the first metal layer comprises a first source electrode and a first drain electrode corresponding to the pixel driving circuit, and
  a second trace disposed in the frame area,
  wherein the second trace and the gate driving circuit are not overlapped, and the second trace and the first trace are connected in parallel through a via hole.

Optionally, a width of the second trace is smaller than a width of the first trace.

Optionally, a vertical projection of the second trace on the substrate is located within a vertical projection of the first trace on the substrate.

Optionally, an edge of a side of the first trace away from the gate driving circuit is a first edge, and the second trace away from an edge of one side of the gate driving circuit is a second edge, and the first edge is leveled with the second edge.

Optionally, the first trace comprises a first part and a second part, the first part and the second trace are arranged overlapped, the second part and the second trace are not overlapped, wherein a width of the first parti smaller than a width of the second part.

Optionally, the width of the first part is the first width, the width of the second part is the second width, and the first width is more than 7 times of the second width.

Optionally, a sum of the first width and the second width is greater than 150 μm, and the first width is 10 μm-20 μm.

Optionally, a vertical projection of the second trace on the substrate is within a vertical projection of the first trace on the substrate, wherein the first trace further comprises a plurality of hollow parts, and the hollow parts and the second trace are not overlapped.

Optionally, the display device comprises a casing and any one of the above display panels, the casing has an accommodating space, and the display panel is disposed in in the accommodating space.

The present application provides a display panel and a display device. In the display panel provided by the present application, a first trace electrically connected to a second electrode is formed in a frame area, and by partially overlapping at least parts of first trace and the gate driving circuit, the first trace can use the space occupied by the gate driving circuit to widen a width, which not only reduces a resistance of the first trace, improves the signal transmission quality, but also maintains a narrower frame width of the display panel.

BRIEF DESCRIPTION OF DRAWINGS

To detailly explain the technical schemes of the embodiments or existing techniques, drawings that are used to illustrate the embodiments or existing techniques are provided. Apparently, the illustrated embodiments are just a part of those of the present disclosure. It is easy for any person having ordinary skill in the art to obtain other drawings without labor for inventiveness.

DETAILED DESCRIPTION

Figure 1:
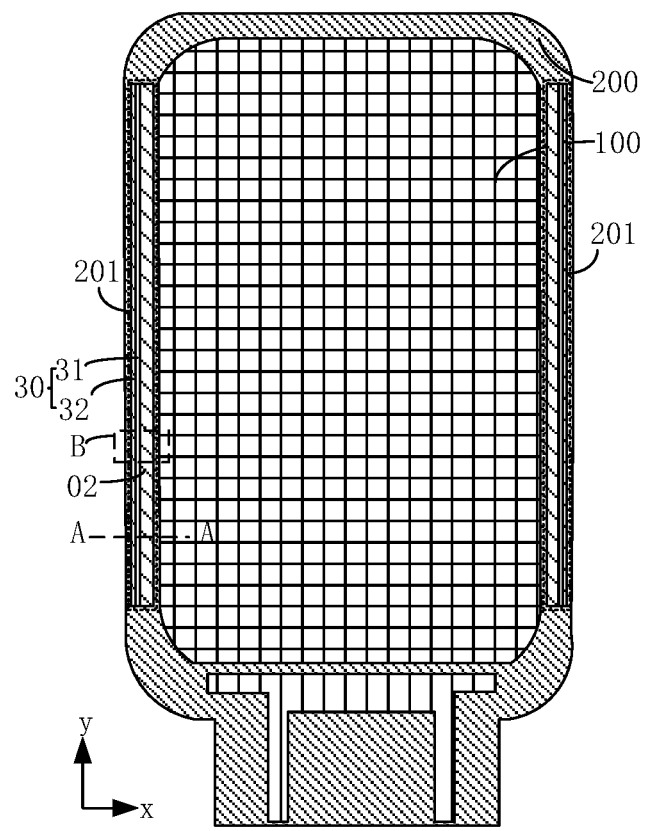
FIG. 1 is a schematic plan view of a first trace, a second trace and a gate driving circuit in a display panel provided by an embodiment of the present application.

Technical solutions in the embodiments of the present application will be clearly and completely described below with reference to the drawings in the embodiments of the present application. Obviously, the described embodiments are only a part of the embodiments of the present application, but not all of the embodiments. Based on the embodiments in the present application, all other embodiments obtained by those skilled in the art without creative work fall within the protection scope of the present application. In addition, it should be understood that the specific embodiments described herein are only used to illustrate and explain the present application, but not to limit the present application. In this application, unless otherwise stated, the directional words used such as "upper" and "lower" generally refer to the upper and lower sides of the device in actual use or working state, specifically the drawing direction in the accompanying drawings while "inside" and "outside" refer to the outline of the device.

The following disclosure provides many different embodiments or examples for implementing different structures of the present application. To simplify the disclosure of the present application, the components and arrangements of specific examples are described below. Of course, they are only examples and are not intended to limit the application. Furthermore, this application may repeat reference numerals and/or reference letters in different instances for the purpose of simplicity and clarity and does not in itself indicate a relationship between the various embodiments and/or arrangements discussed. In addition, this application provides examples of various specific processes and materials, but one of ordinary skill in the art will recognize the application of other processes and/or the use of other materials. The following detailed descriptions are provided respectively. It should be noted that the description order of the following embodiments is not intended to limit the preferred order of the embodiments.

Figure 2:
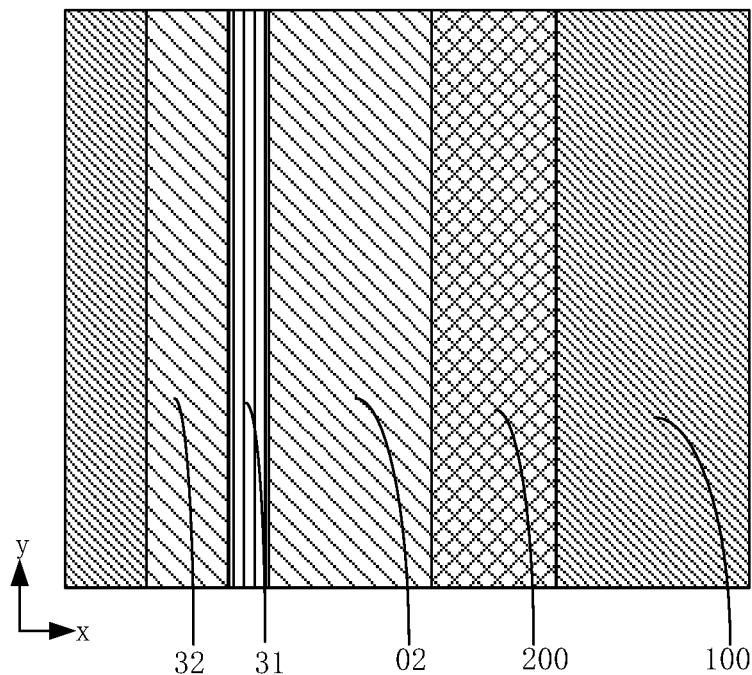
FIG. 2 is an enlarged schematic diagram of the first trace, the second trace and the gate driving circuit in the display panel at a place B in FIG. 1 provided by the embodiment of the present application.
Figure 3:
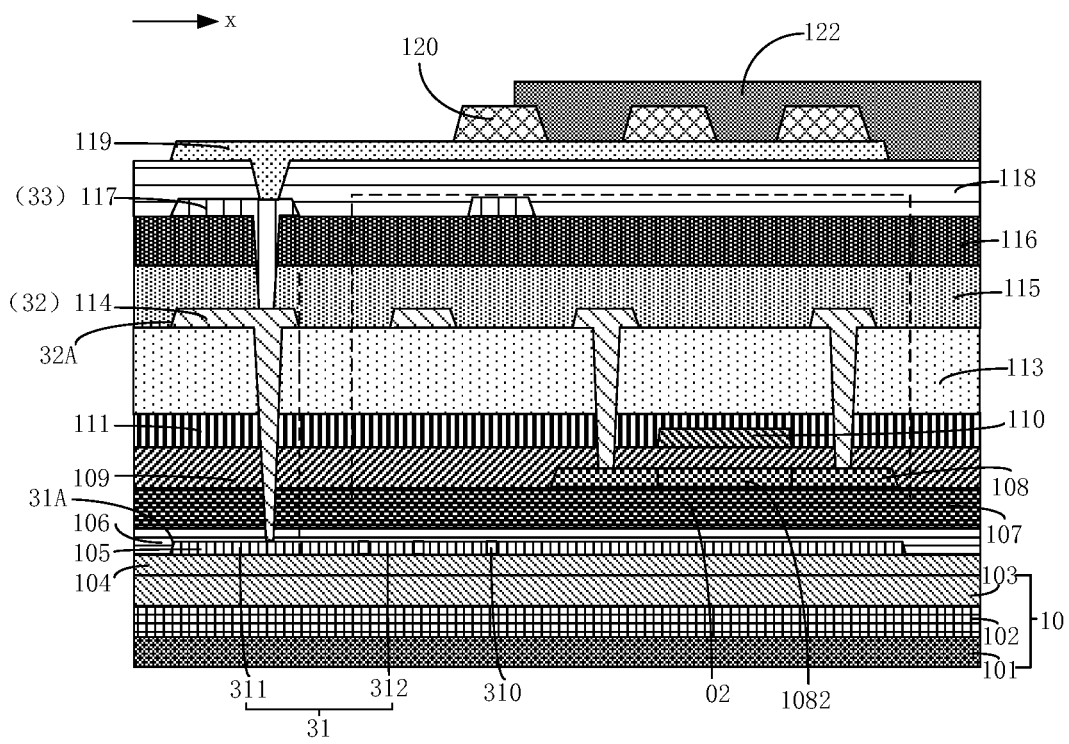
FIG. 3 is a schematic cross-sectional view along a line AA in FIG. 1 of a display panel in a frame area provided by an embodiment of the present application.
Figure 4:
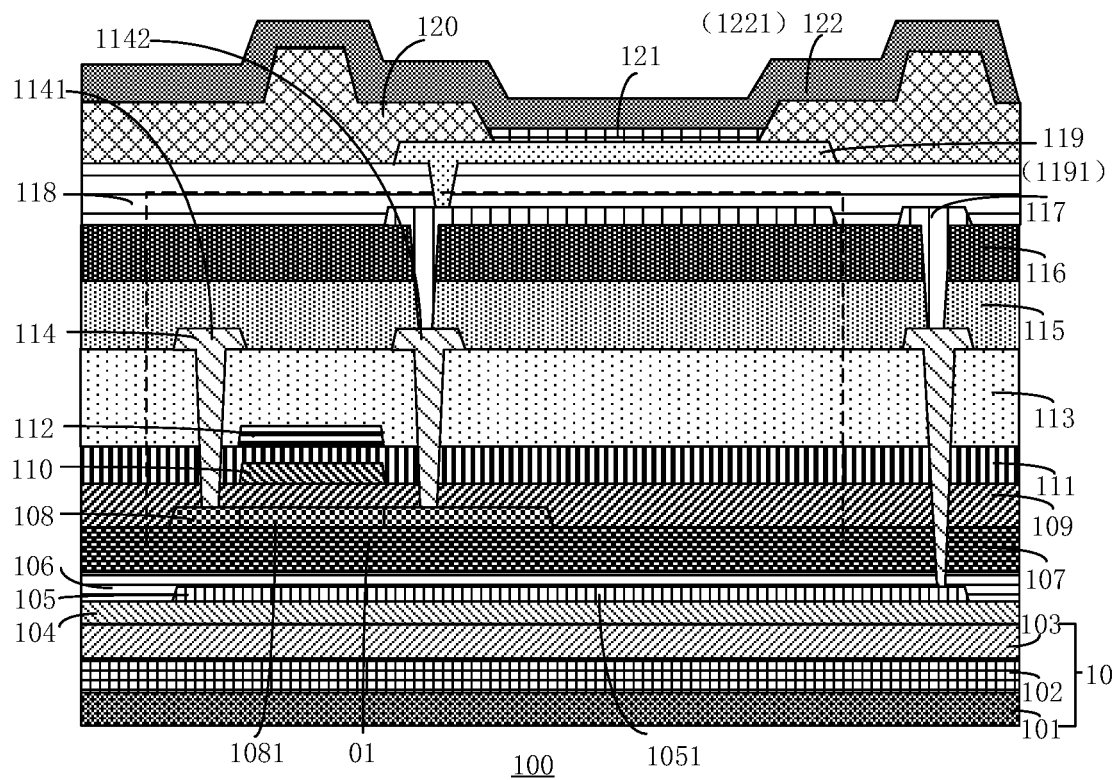
FIG. 4 is a schematic cross-sectional view of a display panel of a display area provided by an embodiment of the present application.

FIG. 1 is a schematic plan view of a first trace, a second trace and a gate driving circuit in a display panel provided by an embodiment of the application. FIG. 2 is an enlarged schematic view at a place B of the first trace, the second trace and the gate driving circuit in a display panel provided by an embodiment of the application. FIG. 3 is a schematic cross-sectional view along a line AA in FIG. 1 of a display panel in a frame area provided by an embodiment of the present application. FIG. 4 is a schematic cross-sectional view of a display panel of a display area provided by an embodiment of the present application. Referring to FIG. 1, FIG. 2, FIG. 3 and FIG. 4, an embodiment of the present application provides a display panel. The display panel comprises a display area 100 and a frame area 201 disposed on a side of the display area 100. The display panel comprises a substrate 10; a light-shielding metal layer 105 disposed on a side of the substrate 10, wherein the light-shielding metal layer 105 comprises a first trace 31 disposed in the frame area 201; a driving circuit layer disposed on a side of the light-shielding metal layer 105 away from the substrate 10, wherein the driving circuit layer comprises a pixel driving circuit 01 disposed in the display area 100 and a gate driving circuit 02 disposed in the frame area 201, wherein the gate driving circuit 02 is electrically connected to the pixel driving circuit 01; a first electrode 1191 disposed on a side of the driving circuit layer away from the substrate 10; a light-emitting layer 121 disposed on a side of the first electrode 1191 away from the substrate 10; and a second electrode 1221 is disposed on a side of the light-emitting layer 121 away from the substrate 10, and the second electrode 1221 and the first trace 31 are electrically connected through a via hole, wherein the first trace 31 and the gate driving circuit 02 are at least partially overlapped.

In the display panel provided by the present application, the present application forms a first trace 31 electrically connected to the second electrode 1221 in the frame area 201. By at least partially overlapping the first trace 31 with the gate driving circuit 02, the first trace 31 can use the space in a lateral direction x occupied by the gate driving circuit 02 to widen a width, which not only reduces the resistance of the first trace 31, but also maintains the display panel with a narrow frame width and increase a screen ratio of the display panel.

Specifically, a cathode trace 30 of the display panel comprises the first trace 31, and the first trace 31 is used to transmit the VSS signal to the second electrode. The gate driving circuit 02 and the first trace 31 are at least partially overlapped, which can greatly increase the width of the first trace 31, improve the VSS signal transmission capability of the cathode trace 30, ensure the uniformity of the display panel, and avoid the occurrence uneven display of the display panel during the display process.

Furthermore, the pixel driving circuit 01 comprises a first thin film transistor disposed on a side of the light-shielding metal layer 105 away from the substrate 10, and the first thin film transistor comprises a channel. The light-shielding metal layer 105 further comprises a light-shielding part 1051 disposed in the display area 100, and the light-shielding part 1051 is disposed to overlap with the channel of the first thin film transistor to avoid the problem of device performance deterioration caused by ambient light irradiating the channel from a side of the substrate 10 away from the first thin film transistor. That is, the first trace 31 and the light shielding part 1051 are disposed in the same layer. Due to the requirement of the light shielding part 1051, the light shielding metal layer 105 cannot be omitted. Therefore, the setting of the first trace 31 does not increase the film layer structure and the number of masks of the display panel.

In some embodiments of the present application, the driving circuit layer comprises a semiconductor layer 108 disposed on a side of the light-shielding metal layer 105 away from the substrate 10. The semiconductor layer 108 comprises a first semiconductor 1081 corresponding to the pixel driving circuit 01 and a second semiconductor 1082 corresponding to the gate driving circuit 02; a first metal layer 114 disposed on a side of the semiconductor layer 108 away from the substrate 10, and the first metal layer 114 comprises a first source electrode 1141 and a first drain electrode 1142 corresponding to the pixel driving circuit 01 and a second trace 32 disposed in the frame area 201. Herein, the second trace 32 and the gate driving circuit 02 are not overlapped, and the second trace 32 and the first trace 31 are connected in parallel through a via hole.

Specifically, referring to FIG. 1, in the frame area 201, the gate driving circuit 02, the first trace 31, and the second trace 32 all extend along a longitudinal direction y, and the first trace 31 and the second trace 32 have a continuous trace structure. Herein, the second trace 32 is located on a side of the gate driving circuit 02 away from the display area 100 and is at least partially overlapped with the first trace 31, and the first trace 31 is connected in parallel with the second trace 32 through a plurality of via holes (not shown in the figure) arranged at intervals along the longitudinal direction y. That is, the cathode trace 30 comprises the first trace 31 and the second trace 32, and since the second trace 32 is connected in parallel with the first trace 31, the impedance of the cathode trace 30 can be reduced and the VSS signal transmission capability of the cathode trace 30 is further increased.

In some embodiments of the present application, a width of the second trace 32 is smaller than a width of the first trace 31.

It should be noted that, in the frame area 201, the widths of the first trace 31 and the second trace 32 refer to the widths of the first trace 31 and the second trace 32 in the extension along the lateral direction x. Since the second trace 32 and the gate driving circuit 02 are not overlapped, the second trace 32 and the gate driving circuit 02 will jointly occupy the space of the frame area 201. By making the width of the second trace 32 smaller than the width of the first trace 31, the problem of increasing the width of the frame caused by the arrangement of the second trace 32 can be reduced or avoided.

In some embodiments of the present application, a vertical projection of the second trace 32 on the substrate 10 is located within a vertical projection of the first trace 31 on the substrate 10.

Since the first trace 31 needs to be electrically connected to the second electrode 1221 through the via hole, the first trace 31 comprises a part that does not overlap with the gate driving circuit 02. In the present application, the vertical projection of the second trace 32 on the substrate 10 is located within the vertical projection of the first trace 31 on the substrate 10, so that the first trace can be fully utilized. The space in the lateral direction x occupied by the part of the line 31 that does not overlap with the gate driving circuit 02 avoids the problem of increasing the width of the frame caused by the arrangement of the second trace 32.

In some embodiments of the present application, an edge of the side of the first trace 31 away from the gate driving circuit 02 is a first edge 31A, and an edge of the side of the second trace 32 away from the gate driving circuit 02 is a second edge 32A, and the first edge 31A is level with the second edge 32A.

That is, an orthographic projection of the first edge 31A on the substrate 10 and an orthographic projection of the second edge 32A on the substrate 10 are overlapped, and a contour shape of the first edge 31A is the same as that of the first edge 31A. The contour shape of the second edge 32A is kept consistent, so that the second trace 32 can make full use of the lateral direction x occupied by the part of the first trace 31 that does not overlap with the gate driving circuit 02, while avoiding the increase of the frame width caused by the arrangement of the second trace 32, the width of the second trace 32 is maximized to further reduce the resistance of the cathode trace 30.

In some embodiments of the present application, in the lateral direction x, the width of the second trace 32 is the same as the width of the via hole connecting the first trace 31 and the second trace 32, and the first edge 31A is level with the second edge 32A.

Since the via hole connecting the first trace 31 and the second trace 32 is a necessary structure to realize the electrical connection between the first trace 31 and the second trace 32, the present application makes the width of the second trace 32 is set to be the same as the width of the via hole connecting the first trace 31 and the second trace 32 along the lateral direction x, so that the second trace 32 maximizes the narrowing the width of the second trace 32 while using the space in the lateral direction x occupied by the part of the first trace 31 that does not overlap with the gate driving circuit 02. In addition, since the first edge 31A is level with the second edge 32A, the width of the part where the first trace 31 does not overlap with the gate driving circuit 02 can be minimized, thereby further reducing the width of the frame area 201 to realize an ultra-narrow frame and further increase the screen ratio. As an example, the width of the second trace 32 is 10 μm-20 μm, such as 10 μm, 13 μm, 15 μm, 18 μm, 20 μm, and the like.

Further, referring to FIG. 3, the first trace 31 comprises a first part 311 and a second part 312. The first part 311 and the second trace 32 are overlapped, and the second part 312 is not overlapped with the second trace 32. Herein, the width of the first part 311 is smaller than the width of the second part 312.

Specifically, the second part 312 is located on the side of the first part 311 facing the gate driving circuit 02, that is, the part of the first trace 31 overlapping with the gate driving circuit 02 belongs to the second part 312. In the prior art, a gate driving pattern in a gate driving circuit generally comprises a trace pattern and some component patterns in a thin film transistor, and its width in the lateral direction x is generally larger. The second part 312 of the first trace 31 with a larger part disposed on the side of the first part 311 facing the gate driving circuit 02, so that the width of the first trace 31 is widened as much as possible based on fully utilizing of the space occupied by the gate driving circuit 02 on the lateral direction x, thereby further reducing the resistance of the cathode trace 30 and improving the signal transmission capability of the cathode trace 30.

Furthermore, the width of the first part 311 is the first width, the width of the second part 312 is the second width, the first width is more than 7 times the second width, a sum of the first width and the second width is greater than 150 μm, and the first width is 10 μm-20 μm.

In some embodiments of the present application, a vertical projection of the second semiconductor 1082 on the substrate 10 is located within a vertical projection of the first trace 31 on the substrate 10.

Specifically, the gate driving circuit 02 comprises a second thin film transistor, and the second thin film transistor comprises a second semiconductor 1082. The inventor of the present application has found that the charges on the substrate 10 easily affect the performance of the second semiconductor 1082, which easily leads to the characteristic drifts of the second thin film transistor and affects the operation stability of the device. In the present application, by overlapping the first trace 31 with the second semiconductor 1082, the charges on the substrate 10 can be prevented from affecting the performance of the second semiconductor 1082, and the operation stability of the device can be improved. The second thin film transistor shown in FIG. 3 is a single-gate thin film transistor, and in other embodiments of the present application, the second thin film transistor may also be a double-gate thin film transistor.

Furthermore, the first trace 31 further comprises a plurality of hollow parts 310, and the hollow parts 310 and the second semiconductor 1082 are not overlapped.

Specifically, the inventor of the present application has further studied and found that, during circuit design, a large-area trace structure is prone to problems of electrostatic damage or peeling. In order to avoid the above problems, the present application solves the possible problems of electrostatic damage or film peeling by disposing the hollow parts 310 on the first trace 31. In addition, since the hollow parts 310 and the second semiconductor 1082 are not overlapped, the arrangement of the hollow parts 310 do not affect the performance of the second semiconductor 1082.

In some embodiments of the present application, the driving circuit layer further comprises a second metal layer 117 disposed on a side of the first metal layer 114 away from the substrate 10. Herein, the second metal layer 117 comprises a third trace 33 disposed in the frame area 201. Herein, the third trace 33 and the gate driving circuit 02 are not overlapped, and the third trace 33 and the first trace 31 are connected in parallel through a via hole.

In some embodiments of the present application, the cathode trace 30 comprises the first trace 31, the second trace 32 and the third trace 33. Herein, the third trace 33 and the setting manner of the second trace 32 is similar, and details are not described herein again in this application.

As shown in FIG. 3 and FIG. 4, in the display panel provided by the present application, the substrate 10 comprises a first substrate layer 101; a substrate barrier layer 102 disposed on a side of the first substrate layer 101 facing the light-shielding metal layer 105; and a second substrate layer 103 disposed on a side of the bottom barrier layer 102 facing light-shielding metal layer 105.

The display panel provided by the present application further includes: a first barrier layer 104 disposed on the side of the second substrate layer 103 facing the light-shielding metal layer 105. The light-shielding metal layer 105 is disposed on a side of the first barrier layer 104 away from the substrate 10.

The display panel provided by the present application further comprises a second barrier layer 106 disposed on a side of the light-shielding metal layer 105 facing the driving circuit layer; and a buffer layer 107 disposed on a side of the second barrier layer 106 facing the driving circuit layer. The driving circuit layer is disposed on a side of the buffer layer 107 away from the substrate 10.

In the display panel provided in the present application, the driving circuit layer comprises a semiconductor layer 108 disposed on a side of the buffer layer 107 away from the substrate 10; a first gate insulating layer 109 disposed on a side of the semiconductor layer 108 away from the substrate 10; a third metal layer 110 disposed on a side of the first gate insulating layer 109 away from the substrate 10; a second gate insulating layer 111 disposed on a side of the first gate insulating layer 109 away from the substrate 10; a fourth metal layer 112 disposed on a side of the second gate insulating layer 111 away from the substrate 10; an interlayer dielectric layer 113 disposed on a side of the fourth metal layer 112 away from the substrate; a first metal layer 114 disposed on a side of the interlayer dielectric layer 113 away from the substrate 10; a passivation layer 115 disposed on a side of the first metal layer 114 away from the substrate 10; a first planarization layer 116 disposed on a side of the passivation layer 115 away from the substrate 10; a second metal layer 117 disposed on a side of the first planarization layer 116 away from the substrate 10; and a second planarization layer 118 disposed on a side of the second metal layer 117 away from the substrate 10.

In the display panel provided in the present application, the display panel further comprises a first electrode layer 119 disposed on a side of the driving circuit layer away from the substrate 10 and including the first electrode 1191. Herein, the first electrode 1191 is, for example, an anode.

In the display panel provided in the present application, the display panel further comprises a pixel definition layer 120 and a light-emitting layer 121, both of which are disposed on a side of the first electrode layer 119 away from the substrate 10. Herein, the pixel definition layer 120 is formed with a pixel definition opening, and the light emitting layer 121 is accommodated in the pixel definition opening.

In the display panel provided in the present application, the display panel further comprise a second electrode layer 122 disposed on a side of the light-emitting layer 121 away from the substrate 10 and including the second electrode 1221. Herein, the second electrode 1221 is, for example, a cathode.

Figure 5:
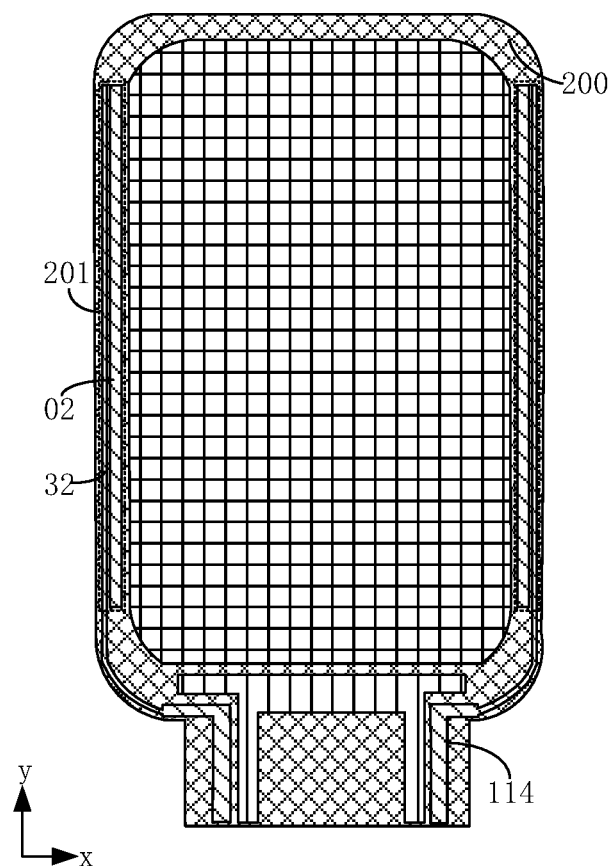
FIG. 5 is a schematic plan view of the first metal layer in the frame area according to an embodiment of the present application.

FIG. 5 is a schematic plan view of the first metal layer 114 of the frame area 201 according to an embodiment of the present application. Referring to FIG. 5, the display panel comprises a non-display area 200 surrounding the display area 100. Herein, the non-display area 200 comprises four frame areas 201, and the second trace 32 crosses two adjacent frame areas 201.

Specifically, referring to FIGS. 4 and 5, the second traces 32 in the non-display area 200 have two different widths. Herein, along the direction perpendicular to the substrate 10, a first trace 31 is correspondingly provided on a side of the second traces 32 facing the substrate having a narrower width.

On the other hand, the present application also provides a display device, and the display device comprises a casing and the display panel according to any one of the above. The casing has an accommodating space, and the display panel is disposed in the casing. The display panel comprise a display area 100 and a frame area 201 arranged on a side of the display area 100. The display panel comprise a substrate 10; a light-shielding metal layer 105 disposed on a side of the substrate 10, wherein the light-shielding metal layer 105 comprises a first trace 31 disposed in the frame area 201; a driving circuit layer disposed on a side of the light-shielding metal layer 105 away from the substrate, wherein the driving circuit layer comprises a pixel driving circuit 01 disposed in the display area 100 and a gate driving circuit 02 disposed in the frame area 201, and the gate driving circuit 02 is electrically connected to the pixel drive circuit 01; a first electrode disposed on a side of the driving circuit layer away from the substrate 10; a light-emitting layer 121 disposed on a side of the first electrode away from the substrate 10; and a second electrode disposed on a side of the light-emitting layer 121 away from the substrate and the second electrode is electrically connected to the first trace 31 through a via hole, wherein, the first trace 31 and the gate driving circuit 02 are at least partially overlapped.

In summary, the present application also provides a display device, and the display device comprises a casing and the display panel according to any one of the above. The casing has an accommodating space, and the display panel is disposed in the casing. The display panel comprises a display area and a frame area arranged on a side of the display area. The display panel comprises a substrate; a light-shielding metal layer disposed on a side of the substrate, wherein the light-shielding metal layer comprises a first trace disposed in the frame area; a driving circuit layer disposed on a side of the light-shielding metal layer away from the substrate, wherein the driving circuit layer comprises a pixel driving circuit disposed in the display area and a gate driving circuit disposed in the frame area, and the gate driving circuit is electrically connected to the pixel drive circuit; a first electrode disposed on a side of the driving circuit layer away from the substrate; a light-emitting layer disposed on a side of the first electrode away from the substrate; and a second electrode disposed on a side of the light-emitting layer away from the substrate, and the second electrode is electrically connected to the first trace through a via hole, wherein, the first trace and the gate driving circuit are at least partially overlapped. The display panel and the display device provided by the present application can reduce the frame width of the display panel and improve the screen ratio while maintaining a better signal transmission capability of the first trace.

The display panel and the display device provided by the embodiments of the present invention are described in detail above. While the present disclosure has been described with the aforementioned preferred embodiments, it is preferable that the above embodiments should not be construed as limiting of the present disclosure. Anyone having ordinary skill in the art can make a variety of modifications and variations without departing from the spirit and scope of the present disclosure as defined by the following claims.

What is claimed is:

1. A display panel, comprising a display area and a frame area arranged on a side of the display area, wherein the display panel comprises:
    a substrate;
    a light-shielding metal layer disposed on a side of the substrate, wherein the light-shielding metal layer comprises a first trace disposed in the frame area;
    a driving circuit layer disposed on a side of the light-shielding metal layer away from the substrate, wherein the driving circuit layer comprises a pixel driving circuit disposed in the display area and a gate driving circuit disposed in the frame area, and the gate driving circuit is electrically connected to the pixel drive circuit;
    a first electrode disposed on a side of the driving circuit layer away from the substrate;
    a light-emitting layer disposed on a side of the first electrode away from the substrate; and
    a second electrode disposed on a side of the light-emitting layer away from the substrate, and the second electrode is electrically connected to the first trace through a via hole,
    wherein, the first trace and the gate driving circuit are at least partially overlapped.

2. The display panel according to claim 1, wherein the driving circuit layer comprises:
    a semiconductor layer disposed on a side of the light-shielding metal layer away from the substrate, wherein the semiconductor layer comprises a first semiconductor corresponding to the pixel driving circuit and a second semiconductor corresponding to the gate driving circuit;
    a first metal layer disposed on a side of the semiconductor layer away from the substrate, wherein the first metal layer comprises a first source electrode and a first drain electrode corresponding to the pixel driving circuit, and a second trace disposed in the frame area,
    wherein the second trace and the gate driving circuit are not overlapped, and the second trace and the first trace are connected in parallel through a via hole.

3. The display panel according to claim 2, wherein a width of the second trace is smaller than a width of the first trace.

4. The display panel according to claim 3, wherein a vertical projection of the second trace on the substrate is located within a vertical projection of the first trace on the substrate.

5. The display panel according to claim 4, wherein an edge of a side of the first trace away from the gate driving circuit is a first edge, and the second trace away from an edge of one side of the gate driving circuit is a second edge, and the first edge is leveled with the second edge.

6. The display panel according to claim 5, wherein the first trace comprises a first part and a second part, the first part and the second trace are arranged overlapped, the second part and the second trace are not overlapped, wherein a width of the first part is smaller than a width of the second part.

7. The display panel according to claim 6, wherein the width of the first part is the first width, the width of the second part is the second width, and the first width is more than 7 times of the second width.

8. The display panel according to claim 7, wherein a sum of the first width and the second width is greater than 150 µm, and the first width is 10 µm-20 µm.

9. The display panel according to claim 1, wherein a vertical projection of the second trace on the substrate is within a vertical projection of the first trace on the substrate, wherein the first trace further comprises a plurality of hollow parts, and the hollow parts and the second trace are not overlapped.

10. A display device, comprising a casing and the display panel according to claim 1, wherein the casing has an accommodating space, and the display panel is disposed in in the accommodating space.

* * * * *